US010884040B2

(12) United States Patent
Liu et al.

(10) Patent No.: US 10,884,040 B2
(45) Date of Patent: Jan. 5, 2021

(54) POWER METERING TRANSDUCER SYSTEM

(71) Applicant: Honeywell International Inc., Morris Plains, NJ (US)

(72) Inventors: Jacky Liu, Tianjin (CN); Kantol Khek, Moorestown, NJ (US)

(73) Assignee: Honeywell International Inc., Charlotte, NC (US)

( * ) Notice: Subject to any disclaimer, the term of this patent is extended or adjusted under 35 U.S.C. 154(b) by 246 days.

(21) Appl. No.: 15/369,339

(22) Filed: Dec. 5, 2016

(65) Prior Publication Data

US 2017/0082667 A1 Mar. 23, 2017

Related U.S. Application Data

(63) Continuation of application No. PCT/CN2014/079247, filed on Jun. 5, 2014.

(51) Int. Cl.
*G01R 11/00* (2006.01)
*G01R 22/10* (2006.01)
*G01R 22/06* (2006.01)

(52) U.S. Cl.
CPC ........... *G01R 22/10* (2013.01); *G01R 22/063* (2013.01); *G01R 22/065* (2013.01); *G01R 22/068* (2013.01)

(58) Field of Classification Search
CPC .. G01R 21/133; G01R 19/2513; G01R 15/18; G01R 21/06; G01R 15/186; G01R 15/183; G01R 19/0092; G01R 31/027; G01R 21/00
See application file for complete search history.

(56) References Cited

U.S. PATENT DOCUMENTS

| 4,315,248 A * | 2/1982 | Ward | H02J 13/00002 340/12.11 |
| 6,713,997 B2 * | 3/2004 | Carlson | G01R 21/133 324/142 |
| 8,928,289 B1 * | 1/2015 | Gorham | H01M 10/441 320/135 |
| 2008/0204953 A1 | 8/2008 | Shuey | |

(Continued)

FOREIGN PATENT DOCUMENTS

| CA | 2405317 A1 | 8/2002 |
| CA | 2740827 A1 | 12/2011 |

(Continued)

OTHER PUBLICATIONS

The International Search Report for related PCT application PCT/CN2014/079247, dated Mar. 4, 2015 (4 pages).

*Primary Examiner* — Alesa Allgood
(74) *Attorney, Agent, or Firm* — Seager Tufte & Wickhem LLP

(57) ABSTRACT

Devices, methods, systems, and computer-readable media for power metering are described herein. One or more embodiments include a power metering device, comprising a number of sensors configured to output pulses corresponding to a quantity of power consumed over a period of time, a first module configured to receive the pulses from the number of sensors, and meter power consumption using the output pulses. In addition the power metering device includes a second module configured to communicate with the number of sensors using a plurality of communication protocols.

19 Claims, 4 Drawing Sheets

(56) References Cited

U.S. PATENT DOCUMENTS

| | | | | |
|---|---|---|---|---|
| 2008/0284614 A1* | 11/2008 | Perez | .................... | G01R 22/065 340/870.02 |
| 2009/0309754 A1* | 12/2009 | Bou | ....................... | G01R 15/18 340/870.02 |
| 2014/0184198 A1* | 7/2014 | Cook | .................... | G01R 21/133 324/107 |
| 2015/0061638 A1* | 3/2015 | Reh | ...................... | G01R 21/001 324/76.11 |

FOREIGN PATENT DOCUMENTS

| | | |
|---|---|---|
| CN | 203490267 U | 3/2014 |
| DE | 2640252 A1 | 3/1978 |
| JP | 62217897 A | 1/1987 |

\* cited by examiner

POWER METERING TRANSDUCER SYSTEM

CROSS REFERENCE TO RELATED APPLICATION

This application claims priority to PCT Application No. PCT/CN2014/079247, filed Jun. 5, 2014, which is incorporated herein by reference in its entirety.

TECHNICAL FIELD

The present disclosure relates to methods, devices, system, and computer-readable media for power metering.

BACKGROUND

Power metering systems can be utilized to determine a power consumption of a number of power consuming devices. For example, power metering systems can be utilized to determine power consumption of a building (e.g., office building, house, etc.) and/or power consuming devices of the building.

Power metering systems can utilize transducers to convert a signal that is one form to a signal in a different form. For example, transducers can be used in sensor devices to convert received electrical pulses to a quantity of power utilized and/or consumed.

DETAILED DESCRIPTION

Figure 1:
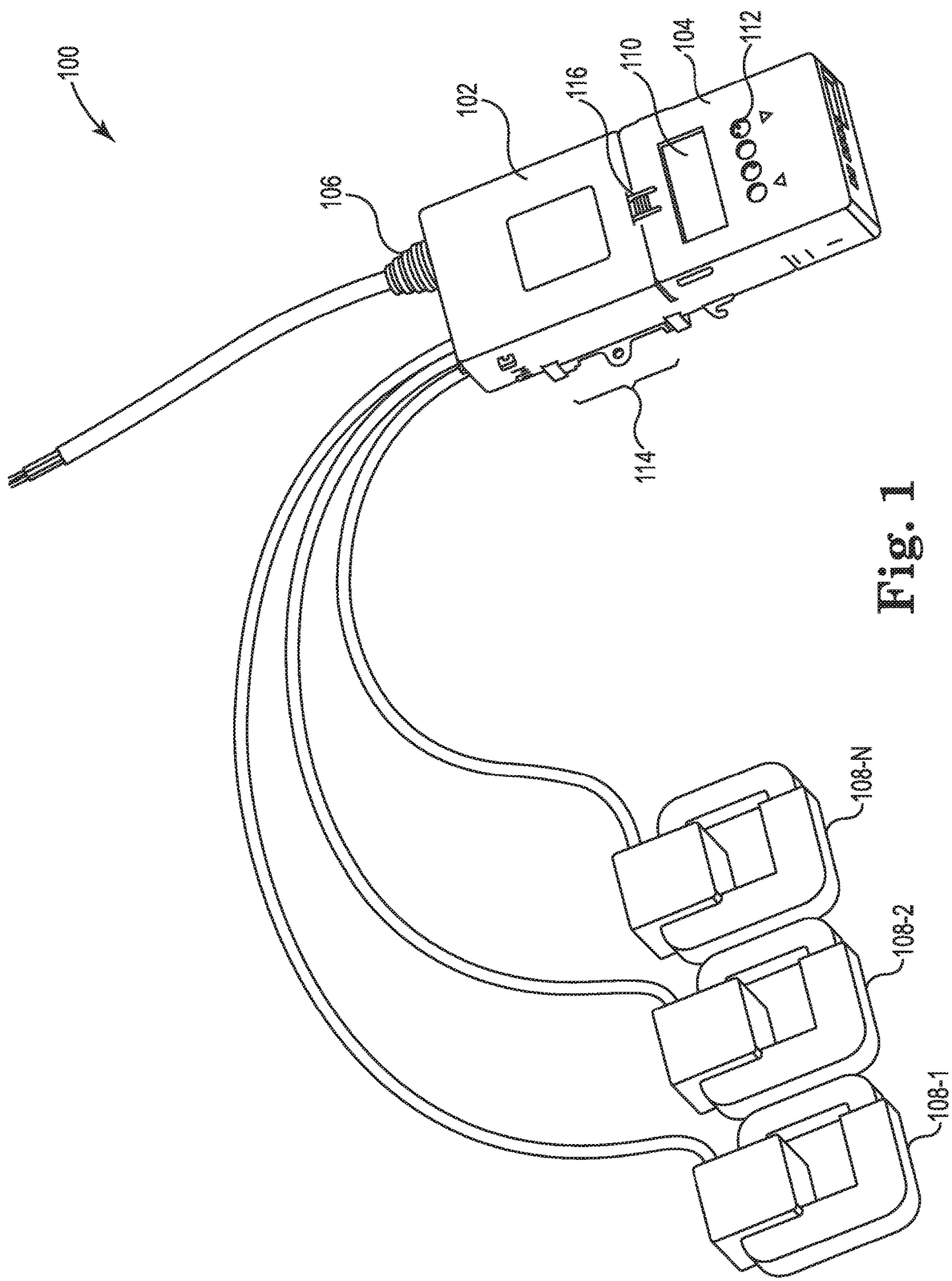
FIG. 1 is an example of a system for power metering according to one or more embodiments of the present disclosure.

Devices, methods, systems, and computer-readable media for power metering are described herein. For example, one or more embodiments include a power metering device, comprising a number of sensors configured to output pulses corresponding to a quantity of power consumed over a period of time, a first module configured to receive the pulses from the number of sensors, and meter power consumption using the output pulses. In addition the power metering device includes a second module configured to communicate with the number of sensors using a plurality of communication protocols.

The power metering systems described herein can include a multi-device system that includes at least two physical devices that are detachable. The first device can have a relatively limited functionality as compared to the second device. For example, in some embodiments, the first device can be limited to metering power consumption. That is, the first device may not be capable of providing communication protocols, determining diagnostics of the system, among other functions.

The second device can couple to the first device and utilize a power supply that is connected to the first device. The second device can have a relatively high functionality compared to the first device. For example, the second device can include a plurality of communication protocols that can be utilized to perform a plurality of functions.

Utilizing a multi-device power metering system as described herein can have many advantages. For example, the first device can be installed as permanent or semi-permanent device to perform a basic metering of power. Additionally, a number of users can be provided with the second device to add the additional functionality provided by the second device when the additional functionality is desired. In this example, an organization (e.g., electric company, etc.) can install relatively basic devices (e.g., first device) at a lower cost than installing more advanced devices (e.g., second device) at all locations. That is, a number of first devices can be installed at all or some of the locations that an organization needs power metering and a number of second devices can be produced and assigned to technicians. The number of second devices can be a smaller quantity than the number of first devices to save costs.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits.

As used herein, "a" or "a number of" something can refer to one or more such things. For example, "a number of sensors" can refer to one or more sensors. Additionally, the designator "N", as used herein, particularly with respect to reference numerals in the drawings, indicates that a number of the particular feature so designated can be included with a number of embodiments of the present disclosure.

FIG. 1 is an example of a system 100 for power metering according to one or more embodiments of the present disclosure. The system 100 can include a power supply 106 coupled to a device 102, and a device 104 coupled to device 102. The device 102 and the device 104 can be individual physical devices that can be coupled together via a latch 116 to connect a number of contacts of the device 102 and the device 104. The number of contacts can enable communication between the device 102 and the device 104. In addition, the number of contacts can enable power from the power supply 106 to be transferred to power the device 104.

In some embodiments, the devices 102 and 104 can include a number of modules (e.g., software modules, etc.) that can be executed by a processor to perform a number of functions. For example, the device 102 can include modules to meter (e.g., determine) power consumption (e.g., quantity of electrical energy consumed, etc.) using received pulse outputs from a number of sensors 108-1, 108-2, . . . , 108-N. Sensors 108-1, 108-2, . . . , 108-N can be coupled to device 102, as shown in FIG. 1, and/or be considered a part of device 102. The received pulse outputs can correspond to a quantity of power (e.g., electrical energy) that is utilized and/or consumed by a number of power consuming devices over a period of time. In some embodiments, the quantity of power that is utilized and/or consumed can be measured in kilowatt-hours.

The number of sensors 108-1, 108-2, . . . , 108-N can include a variety of different types of sensors that can sense the quantity of power consumed by the power consuming devices. For example, the number of sensors can include split-core sensors and/or solid-core sensors. In addition the number of sensors can be a variety of different sizes and/or have different detection ranges. In some embodiments, the device 102 can include a number of terminals that couple the device 102 to the number of sensors 108-1, 108-2, . . . , 108-N. In some embodiments, the number of terminals of the device 102 can correspond to a particular sensor size and/or sensor type.

In some embodiments, device 102 can use a KYZ interface to meter a number of sensor pulse outputs. In a KYZ interface, the Y and Z wires are switch contacts, shorted to K for a measured amount of energy. In addition, when one contact closes the other contact opens to provide count accuracy security. Each contact change of state is considered one pulse. The frequency of pulses indicates the power demand. The number of pulses indicates energy metered (e.g., power consumption, etc.).

In some embodiments, the device 102 can have a relatively limited functionality as compared to device 104. For example, the device 102 can be limited to metering power consumption for a particular area (e.g., building, house, area within a building, etc.). That is, in some embodiments, the device 102 can be a relatively simple meter (e.g., kilowatt meter, etc.) that is not able to perform relatively advanced functions including, but not limited to: display settings, display diagnostics, display information relating to the system 100, receive setting changes, receive setup information, receive protocols, and send protocols, among other functions.

The device 102 can include a mount 114, as shown in FIG. 1. The mount 114 can include a mounting device such as a Deutsches Institut für Normung (DIN) rail mount. A DIN rail mount can be a mount comprising a metal rail of a type used for mounting circuit breakers and industrial control equipment inside equipment racks. The DIN rail mount can be made from cold rolled carbon steel sheet with a zinc-plated and chromated bright surface finish. In addition, or alternatively, the mount 114 can be a free hanging mount. Furthermore, the mount 114 can be a panel mount to mount the device 102 into a cut out of a panel, box, or frame.

The mount 114 can be a permanent or semi-permanent mount to attach the device 102 to a rail, panel, box, frame, or other device, depending on the application. For example, the mount 114 can be attached to a rail of a server and/or data center via a DIN rail mount.

As described herein, the device 104 can be detachable from the device 102. A user (e.g., technician, repairman, system administrator, etc.) can utilize the device 104 to attach to device 102 and utilize additional functionality to the system 100 in embodiments where the device 104 is detachable from the device 102. For example, the device 102 can be a permanent or semi-permanent device that meters power in the system 100, and a user can attach the device 104 when additional functionality is desired for the system 100. Thus, the additional functionality can be reserved for users that have the device 104 and/or users that have permission to utilize the additional functionality provided by the device 104. It can be advantageous to limit permanent functionality within the system 100.

In addition, it can be advantageous to add additional functionality to a system (e.g., system 100) that is currently utilizing the device 102 in combination with sensors 108-1, 108-2, . . . , 108-N. For example, a system can utilize a device 102 to meter the power consumption, and a user can attach a device 104 to change settings of the system by attaching the device 104 and utilize the user interface 112 and/or display 110 to change the settings of the system. In addition, there can be cost benefits of installing the device 102 at a plurality of locations and utilizing the device 104 to increase functionality of the devices 102 at each of the plurality of locations.

As described herein, the device 104 can include and/or add additional functionality to the device 102. The additional functionality can include, but is not limited to: displaying (e.g., to a user) information relating to the system 100, setting up the settings of system 100, debugging, determining, and/or displaying diagnostic information relating to the system 100 (e.g., diagnostic information relating to the sensors of system 100), browsing and/or displaying information relating to the system 100 (e.g., information communicated from the sensors of system 100), retrieving power consumption data (e.g., from a system coupled to device 104), providing a plurality of communication protocols, and/or utilizing multiple communication protocols simultaneously to meter the power consumption. For example, the device 104 can use a plurality of communication protocols including, but not limited to: EZ7, EZ7 Ethernet, Modbus RTU, BACnet MS/TP, Modbus TCP/IP, and/or LonWorks, among other communication protocols to communicate with sensors 108-1, 108-2, . . . , 108-N. Providing the plurality of communication protocols can provide additional functionality to the device 102 and/or system 100 by enabling a user to communicate with other devices (e.g., device 102, sensors 108-1, 108-2, . . . , 108-N, etc.) within the system 100. In some embodiments, the plurality of communication protocols can be utilized by the device 104 simultaneously to meter the power consumption. That is, the device 104 can send and/or receive different communication protocols within the system 100.

In some embodiments, the user interface 112 of device 104 is the only user interface that comprises a number of input devices (e.g., buttons, touchscreen, etc.) to communicate with other devices (e.g., device 102, sensors 108-1, 108-2, . . . , 108-N, etc.) within the system 100. That is, in some embodiments, communication with system 100 is limited when the device 104 is not coupled to device 102. For example, a user may not be able to change settings of the system 100 when device 104 is not coupled to device 102.

The device 104 can increase a detection range of the number of sensors 108-1, 108-2, . . . , 108-N (e.g., from approximately 25 amps to approximately 3,200 amps) by altering a number of settings of the system 100. Approximately, as used herein, indicates a value within 1-2 amps. That is, approximately 25 amps can include a range consisting of values between 23 amps and 27 amps.

As described herein, the multi-device (e.g., device 102 and device 104, including more than one physical device 102, 104, etc.) system 100 enables a user to provide a first set of functionality when the device 104 is not coupled to device 102 and a second set of functionality when the device 104 is coupled to device 102. As described herein, the first set of functionality can be more limited than the second set of functionality. The more limited functionality can be utilized to prevent users that are not permitted to change settings and/or view data for the system 100. In addition, or alternatively, the first set of functionality can be previously installed for a system 100 and the second set of functionality can enable additional functionality in the field by attaching the device 104. That is, additional functionality can be utilized without having to remove device 102 and move the device 102 to a different location in order to browse information and/or change settings for the system 100.

Figure 2:
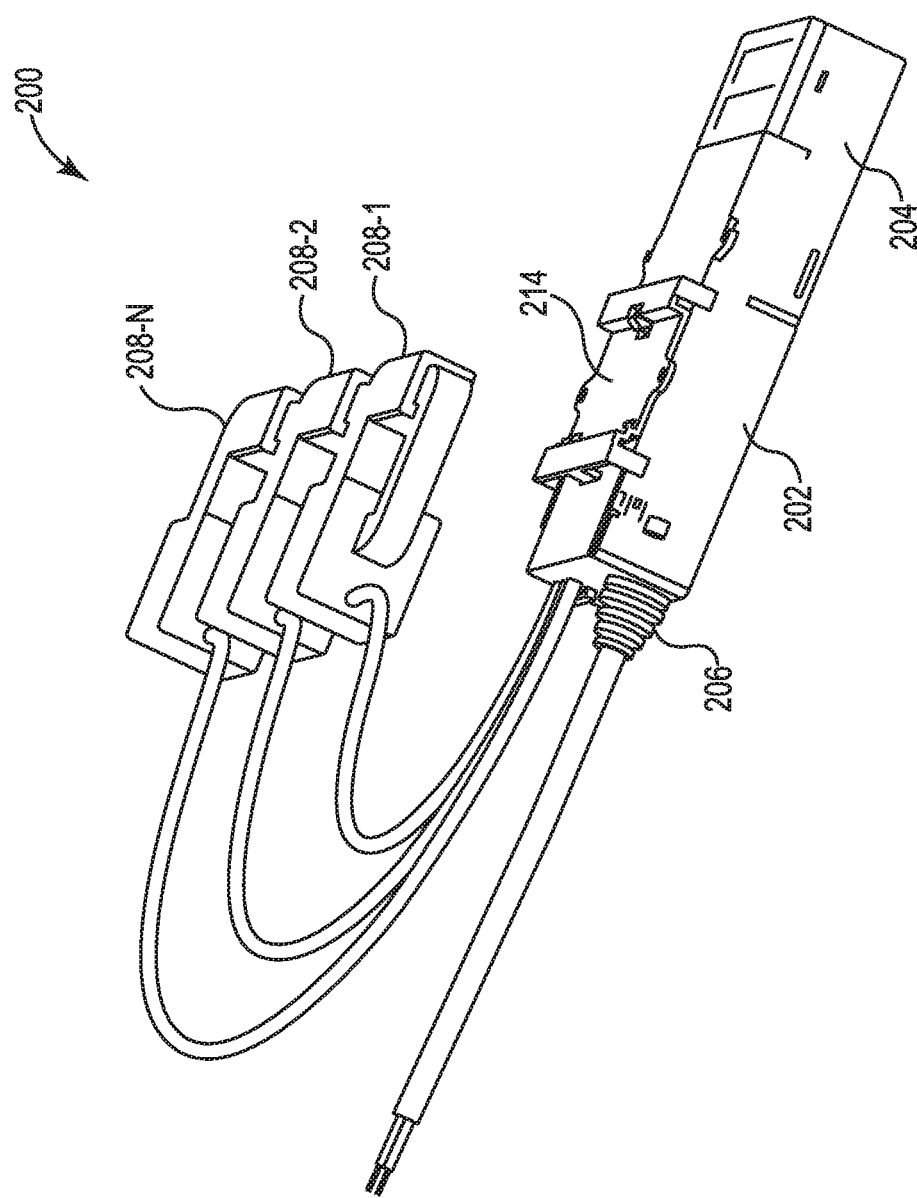
FIG. 2 is an example of a system for power metering according to one or more embodiments of the present disclosure.

FIG. 2 is an example of a system 200 for power metering according to one or more embodiments of the present disclosure. The system 200 can be a "back view" or a "side view" of the system 100 as described in reference to FIG. 1.

FIG. 2 illustrates a mount 214. As described herein in reference to mount 114 in FIG. 1, the mount 214 can be a DIN mount. The mount 214 can be attachable and/or detachable from a rail system of a server and/or data center to permanently or semi-permanently attach device 202 to the rail system. Other mounts can be utilized to attach the device 202 to a rail system or other object based on a particular application.

As described herein, it can be advantageous to have a device 202 permanently or semi-permanently attached to the system 200 and enable a detachable device 204 that can add additional functionality when the additional functionality is needed.

Figure 3:
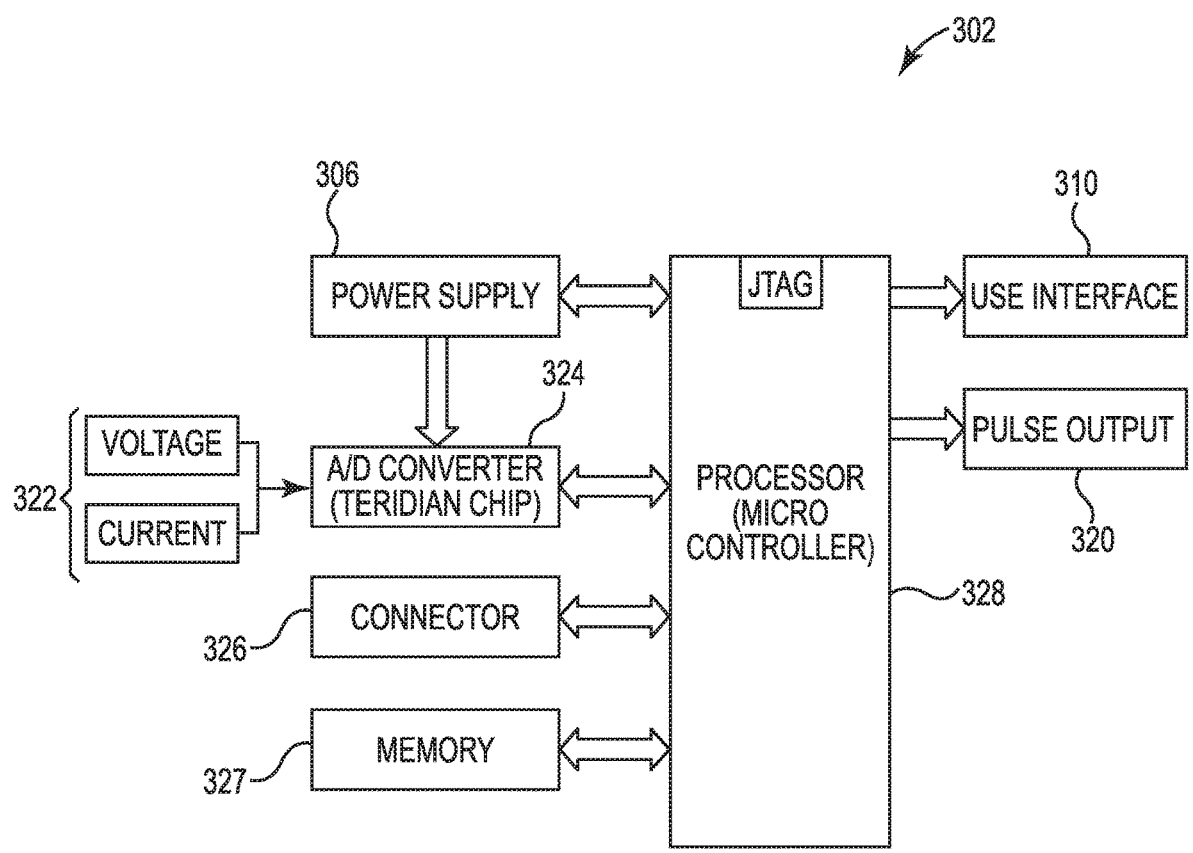
FIG. 3 is an example of a diagram of a device for power metering according to one or more embodiments of the present disclosure.

FIG. 3 is an example of a diagram of a device 302 (e.g., device 102 as referenced in FIG. 1) for power metering according to one or more embodiments of the present disclosure. The device 302 can include a power supply 306 to provide electrical energy to the processor 328 (e.g., microcontroller, TP SAM3S from Linear Technology) and/or the converter 324. The converter 324 can include an analog to digital converter (A/D converter). An A/D converter can be a device that converts a continuous physical quantity (e.g., value, etc.) such as voltage and/or current 322 to a digital number that represents the physical quantity's amplitude.

The A/D converter can be coupled to the processor 328. The value of the physical quantity can be sent to the processor 328 to meter the voltage and/or current 322. The physical quantity can be sent to the processor 328 (e.g., computing device) via a number of pulse outputs 320 (e.g., the pulse outputs from sensors 108-1, 108-2, . . . , 108-N previously described in connection with FIG. 1). As described herein, the pulse outputs 320 can be utilized to meter a power consumption for a particular voltage and/or current 322 usage.

Device 302 includes a memory 327 and the processor 328 coupled to memory 327. Memory 327 can be any type of storage medium that can be accessed by processor 328 to perform various examples of the present disclosure. For example, memory 327 can be a non-transitory computer readable medium having computer readable instructions (e.g., computer program instructions) stored thereon that are executable by processor 328 to retrieve power consumption data with one or more embodiments of the present disclosure.

Memory 327 can be volatile or nonvolatile memory. Memory 327 can also be removable (e.g., portable) memory, or non-removable (e.g., internal) memory. For example, memory 327 can be random access memory (RAM) (e.g., dynamic random access memory (DRAM) and/or phase change random access memory (PCRAM)), read-only memory (ROM) (e.g., electrically erasable programmable read-only memory (EEPROM) and/or compact-disc read-only memory (CD-ROM)), flash memory, a laser disc, a digital versatile disc (DVD) or other optical disk storage, and/or a magnetic medium such as magnetic cassettes, tapes, or disks, among other types of memory.

Further, although memory 327 is illustrated as being located in device 302, embodiments of the present disclosure are not so limited. For example, memory 327 can also be located internal to another computing resource (e.g., enabling computer readable instructions to be downloaded over the Internet or another wired or wireless connection).

Device 302 can also include a user interface 310. User interface 310 can include, for example, a display (e.g., a screen). The display can be, for instance, a touch-screen (e.g., the display can include touch-screen capabilities). User interface 310 can provide (e.g., display and/or present) information to a user of device 302. For example, user interface 310 can provide displays previously described metering information in connection with FIGS. 1 and 2 to the user.

Additionally, device 302 can receive information from the user of computing device 302 through an interaction with the user via user interface 310. For example, device 302 can receive input from the user via user interface 310. The user can enter the input into device 302 by touching the display of user interface 310 in embodiments in which the display includes touch-screen capabilities (e.g., embodiments in which the display is a touch screen). In some embodiments, the power consumption of the voltage and/or current usage can be displayed to a user via the user interface 310 (e.g., LED display, etc.) of device 302.

The device can also include a connector 326 that can be utilized to couple device 302 to a different device (e.g., device 404 as described in connection with FIG. 4, etc.). The connector 326 can be utilized to transfer information between device 302 and the device that is coupled to device 302 via connector 326. For example, the connector 326 can be utilized to transfer metering information that is determined by device 302 to a second device (e.g., device 404 as described in connection with FIG. 4, etc.).

Figure 4:
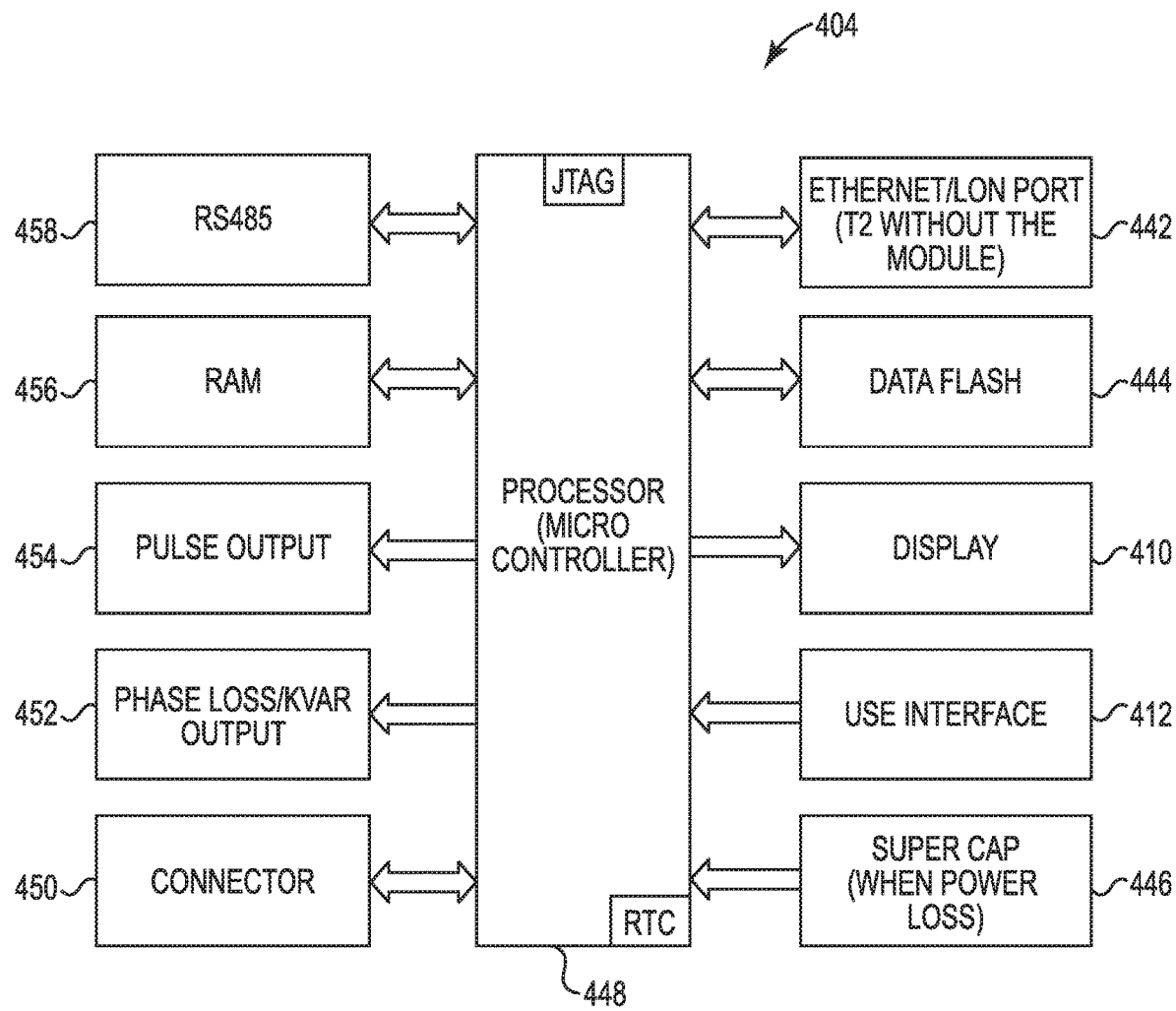
FIG. 4 is an example of a diagram of a device for power metering according to one or more embodiments of the present disclosure.

FIG. 4 is an example of a diagram of a device 404 (e.g., device 104 as referenced in FIG. 1) for power metering according to one or more embodiments of the present disclosure.

The device 404 can include a connector 450 that can connect the device 404 to a different device (e.g., device 102 as referenced in FIG. 1). For example, the device 404 can represent a first device (e.g., device 104 as referenced in FIG. 1) that can be coupled to a second device (e.g., device 102 as referenced in FIG. 1) via the connector 450. The connector 450 can transfer information and/or data to and/or from a different device that is coupled to device 404 using the connector 450. In some embodiments, the connector 450 can transfer power (e.g., electrical power, etc.) to power the different device. In some embodiments, the device represented by diagram 404 can add additional functionality to a different device and/or system when the device is coupled via the connector 450.

The device 404 can include a processor 448 (e.g., microcontroller, T2/T5 LPC2388 from NXP Semiconductors). The processor 448 can provide the pulse output 454 as described herein to determine a power consumption. In addition, the processor 448 can determine and accommodate for reactive power by monitoring phase loss 452.

The device 404 can include other features of a computing device including, but not limited to: an RS485 input/output 458, random access memory 456 (e.g., SRAM, RAM, DRAM, etc.), Ethernet port 442, data flash 444, display (e.g., liquid crystal display) 410, user interface 412 (e.g., buttons, touchscreen, etc.), and/or super cap 446, among other features of a computing device.

A computing device for power metering according to one or more embodiments of the present disclosure can be, for example, device 104 as referenced in FIG. 1, a laptop computer, or a mobile device (e.g., a mobile phone, a personal digital assistant, etc.), among other types of computing devices. As described herein, a computing device (e.g., device 404) can include memory that can be any type of storage medium that can be accessed by processor 448 to perform various examples of the present disclosure. For example, memory can be a non-transitory computer readable medium having computer readable instructions (e.g., computer program instructions) stored thereon that are executable by processor 448 to retrieve power consumption data via a the connector 450 from a different device (e.g., device 102 as referenced in FIG. 1) with one or more embodiments of the present disclosure.

The features of the device represented by diagram 404 can be utilized to provide additional functionality to a different device that is coupled to the connector 450. For example, the user interface 412 and display 410 can be utilized to change a number of settings for a system. As described herein, a user interface 412 can receive information from the user of computing device 404 through an interaction with the user via user interface 412. For example, device 404 can receive input from the user via user interface 412.

As described herein, the device represented by diagram 404 can be a portable device that can brought to a permanently or semi-permanently attached device and add additional functionality to the permanently or semi-permanently attached device when the device represented by device 404 is coupled via the connector 450. In some embodiments, the device 404 can utilize a power supply that is coupled to the permanently or semi-permanently attached device to power the device 404 utilizing the connector 450. For example, the device 404 may not have a connection to a power supply (e.g., connection to an outlet power supply, connection to a battery power supply, etc.) and can utilize the connector 450 to receive power from the permanently or semi-permanently attached device that includes a connection to a power supply (e.g., A/C power supply, D/C power supply, etc.).

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A power consumption metering device, comprising:
a plurality of sensors each configured to output pulses at a frequency that corresponds to a quantity of power currently being consumed, wherein a number of output pulses outputted by each of the plurality of sensors provides an indication of power consumption measured by each of the plurality of sensors;
a first device that is operably coupled to each of the plurality of sensors, and the first device including circuitry that:
receives the output pulses from each of the plurality of sensors;
uses the number of output pulses outputted by each of the plurality of sensors to determine a measure of power consumption measured by each of the plurality of sensors;
stores the determined measure of power consumption in a memory; and
a second device that is releasably securable to the first device, the second device includes a number of electrical contacts that electrically connect to a number of corresponding electrical contacts of the first device when the second device is releasably secured to the first device, the second device is configured to provide additional power consumption metering functionality to the power consumption metering device that is not provided by the first device including the second device communicating with one or more sensors of the plurality of sensors when the second device is releasably secured to the first device, wherein the first device remains functional in determining the measure of power consumption and storing the determined measure of power consumption both with and without the second device secured to the first device.

2. The power consumption metering device of claim 1, wherein the power consumption metering device is configured to increase a detection range of the plurality of sensors.

3. The power consumption metering device of claim 1, wherein when the first device is detached from the second device, the number of electrical contacts of the second device electrically disconnect from the number of corresponding electrical contacts of the first device.

4. The power consumption metering device of claim 1, wherein the first device comprises a mount that includes at least one of:
a free hanging mount;
a panel mount; and
a DIN rail mount.

5. The power consumption metering device of claim 1, wherein the second device is configured to communicate with the one or more sensors of the plurality of sensors using at least two of:
EZ7;
EZ7 Ethernet;
Modbus RTU;

BACnet MS/TP;
Modbus TCP/IP; and
LonWorks.

6. The power consumption metering device of claim 1, wherein each of the plurality of sensors comprise a split core sensor or a solid core sensor.

7. The power consumption metering device of claim 1, wherein the power consumption metering device comprises a user interface configured to:
 display diagnostics of the plurality of sensors; and
 display information communicated from the plurality of sensors.

8. The power consumption metering device of claim 1, wherein the power consumption metering device comprises a number of terminals configured to couple the plurality of sensors to the power consumption metering device.

9. The power consumption metering device of claim 8, wherein each of two or more of the number of terminals of the power consumption metering device correspond to a different sensor size of the plurality of sensors.

10. A computing device for power consumption metering, comprising:
 a memory for storing a plurality of available communication protocols; and
 a processor configured to execute executable instructions stored in the memory to:
  receive pulse outputs from each of a plurality of sensors, the pulse outputs are at a frequency that corresponds to a quantity of power currently being consumed, and wherein a number of the pulse outputs received from each of the plurality of sensors correspond to a quantity of power consumed as measured by the particular sensor of the plurality of sensors;
  determine power consumption using the received pulse outputs;
  determine diagnostic information;
  communicate with each of the number of sensors using a corresponding one of the plurality of available communication protocols; and
  display the power consumption and diagnostic information of the computing device via a user interface of the computing device.

11. The computing device of claim 10, wherein each of two or more of the sensors comprise a different detection range.

12. The computing device of claim 10, wherein the instructions are executable by the processor to receive input, via the user interface, to perform a number of power consumption metering functions.

13. The computing device of claim 12, wherein the number of power consumption metering functions include retrieving power consumption data from a system coupled to the computing device.

14. A system for power consumption metering, comprising:
 a plurality of sensors configured to output pulses at a frequency that corresponds to a quantity of power currently being consumed, wherein a number of output pulses outputted by each of the plurality of sensors provides an indication of power consumption measured by each of the plurality of sensors, and wherein the plurality of sensors comprise one or more of a split core sensor and a solid core sensor;
 a first device receiving the pulses from the plurality of sensors and determining a measure of power consumption based at least in part on how many pulses are received from each of the plurality of sensors; and
 a second device that is releasably detachable from the first device, the second device including a user interface, and a memory for storing a plurality of communication protocols, the second device communicating with each of the plurality of sensors using a corresponding one of the plurality of communication protocols and providing additional power consumption metering functionality.

15. The system of claim 14, wherein the user interface of the second device comprises a display.

16. The system of claim 14, wherein the user interface of the second device comprises a number of input devices to communicate with the system.

17. The system of claim 14, comprising a power supply that is coupled to the first device, wherein the power supply is utilized to power the second device via a connector.

18. The system of claim 14, wherein the first device comprises an analog to digital converter configured to convert the input pulses received by the plurality of sensors.

19. The system of claim 14, wherein the system is configured to use at least two of the plurality of communication protocols simultaneously to meter power consumption using the pulse outputs and communicate the metered power consumption to the user interface.

* * * * *